United States Patent
Liang et al.

(10) Patent No.: US 7,010,770 B2
(45) Date of Patent: Mar. 7, 2006

(54) METHOD OF WIDE WIRE IDENTIFICATION

(75) Inventors: Eric Liang, Jungli (TW); Mu-Jen Huang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 159 days.

(21) Appl. No.: 10/407,352

(22) Filed: Apr. 4, 2003

(65) Prior Publication Data
US 2004/0199886 A1    Oct. 7, 2004

(51) Int. Cl.
G06F 17/50    (2006.01)
G06F 9/45     (2006.01)
G06F 9/455    (2006.01)

(52) U.S. Cl. .............................. 716/13; 716/5; 716/11
(58) Field of Classification Search .............. 716/1–21
See application file for complete search history.

(56) References Cited

U.S. PATENT DOCUMENTS 5,331,572 A * 7/1994 Takahashi .................... 716/11
5,479,357 A * 12/1995 Yoshimura .................... 716/5
6,260,179 B1 * 7/2001 Ohsawa et al. ................ 716/5
6,301,689 B1 * 10/2001 Darden ......................... 716/5
6,330,707 B1 * 12/2001 Shinomiya et al. .......... 716/14
6,629,305 B1 * 9/2003 Ito et al. ...................... 716/11

OTHER PUBLICATIONS

Mentor Graphics Corporation, Basic Rules for Calibre LVS Training Workbook, Software Version 8.6_2, Copyright 1997, 125 pages.

* cited by examiner

*Primary Examiner*—Leigh M. Garbowski
(74) *Attorney, Agent, or Firm*—Duane Morris LLP; Steven E. Koffs

(57) ABSTRACT

A method for analyzing a cell definition comprises the steps of: identifying at least one connectivity target in at least one cell definitions identifying at least one circuit path in the at least one cell definition, the at least one circuit path containing or connected to a circuit portion containing the at least one connectivity target of the cell definition; predicting a routing path to be used by a router to connect a connectivity target in the at least one cell definition to another structure; and determining whether a combination of the predicted routing path and the circuit path causes a violation of an integrated circuit design rule.

23 Claims, 4 Drawing Sheets

METHOD OF WIDE WIRE IDENTIFICATION

FIELD OF THE INVENTION

The present invention relates to integrated circuit fabrication generally, and more specifically to development and use of cell definition libraries for designing integrated circuits.

BACKGROUND

To expedite the development of mask sets for fabricating integrated circuits (ICs), chip designers typically combine standard cells from cell libraries. Cells may contain geometrical objects such as polygons (boundaries), paths, and other cells. Objects in the cell are assigned to "layers" of the design. Typically, the cell definitions are provided by a cell library vendor. The cell library vendor develops each cell separately with the expectation that IC layouts designed using the cell will meet specifications. For example, the Taiwan Semiconductor Manufacturing Company, Ltd. of Taipei, Taiwan, provides a GDSII cell library of over 550 standard cells for 0.13 micron technology.

The IC designer selects the cells it wishes to use in an IC layout to provide whatever structures are required for a particular application. Each cell has one or more connectivity targets, which are predetermined points used to connect the patterns in a pair of cells. The designer submits the configuration of cells to a routing program, which connects the target-containing patterns of the adjacent cells to form complete sets of patterns for each mask layer.

When a design incorporates two cells adjacent to each other in an IC layout, the router identifies the location of the connectivity target in each cell, and constructs a grid of regularly spaced points, such that each target coincides with a grid point. The router then constructs a connecting path between the targets, comprising one or more line segments that connect points of the grid. This connecting path is incorporated into the IC layout, so that the mask constructed from the connected cells includes continuous circuit paths.

In some cases, the connecting path constructed by the router overlaps (at least partially overlies and extends beyond) a circuit path in one or both cells. This occurs when the connectivity target in the cell is not located at the center of the circuit path connected to the feature containing the target. In that case, the masks formed from the circuit design include a merged line formed by the combined projection of the circuit path of the individual cell plus the connecting path formed by the router. The router merges the circuit path and the connecting path into a single line. The width of this merged projection may be greater than the nominal width for the technology used in the IC. For example, in a 0.13 micron IC, the combination of the circuit path and the connecting path formed by the router may result in the mask containing a line up to 0.25 micron wide.

The merged line (circuit path plus the overlapping connecting path) may be sufficiently thick (e.g., 0.25 micron) to require a greater distance between adjacent lines than the minimum required for the thinner line width of the original circuit path, based on the minimum spacing rule in effect for each line thickness. Because the router does not move the existing circuit paths when it constructs the connecting path, the increase in line thickness may even result in a small reduction in the distance between the merged line (formed by the circuit path and the connecting path) and the nearest adjacent line, at the same time that an increase is actually required.

Subsequently, when the IC layout is submitted for verification (for example, using a program such as Calibre, by Mentor Graphics of Wilsonville, Oreg.), the line spacing between each pair of adjacent lines is compared to the relevant minimum for that line. If the line spacing is less than the minimum required for the width of the merged line, a "wide wire" violation is identified. The existing cell designs are not usable for the desired layout.

The designer has two choices: (1) He or she can design a new IC layout; or (2) to render the current IC layout usable, the designer must ask the cell library vendor to revise the cell definition to increase the relevant line spacing, so that no "wide wire" violation occurs when the connecting path is added. Regardless of whether the designer adopts a different IC layout or waits for the cell library vendor to change the cell design, the cost and schedule for completing the IC project are likely to be adversely impacted.

SUMMARY OF THE INVENTION

A method for analyzing a cell definition comprises the steps of: identifying at least one connectivity target in at least one cell definition; identifying at least one circuit path in the at least one cell definition, the at least one circuit path containing or connected to a circuit portion containing the at least one connectivity target of the cell definition; predicting a routing path to be used by a router to connect a connectivity target in the at least one cell definition to another structure; and determining whether a combination of the predicted routing path and the circuit path causes a violation of an integrated circuit design rule.

DETAILED DESCRIPTION

Figure 1:
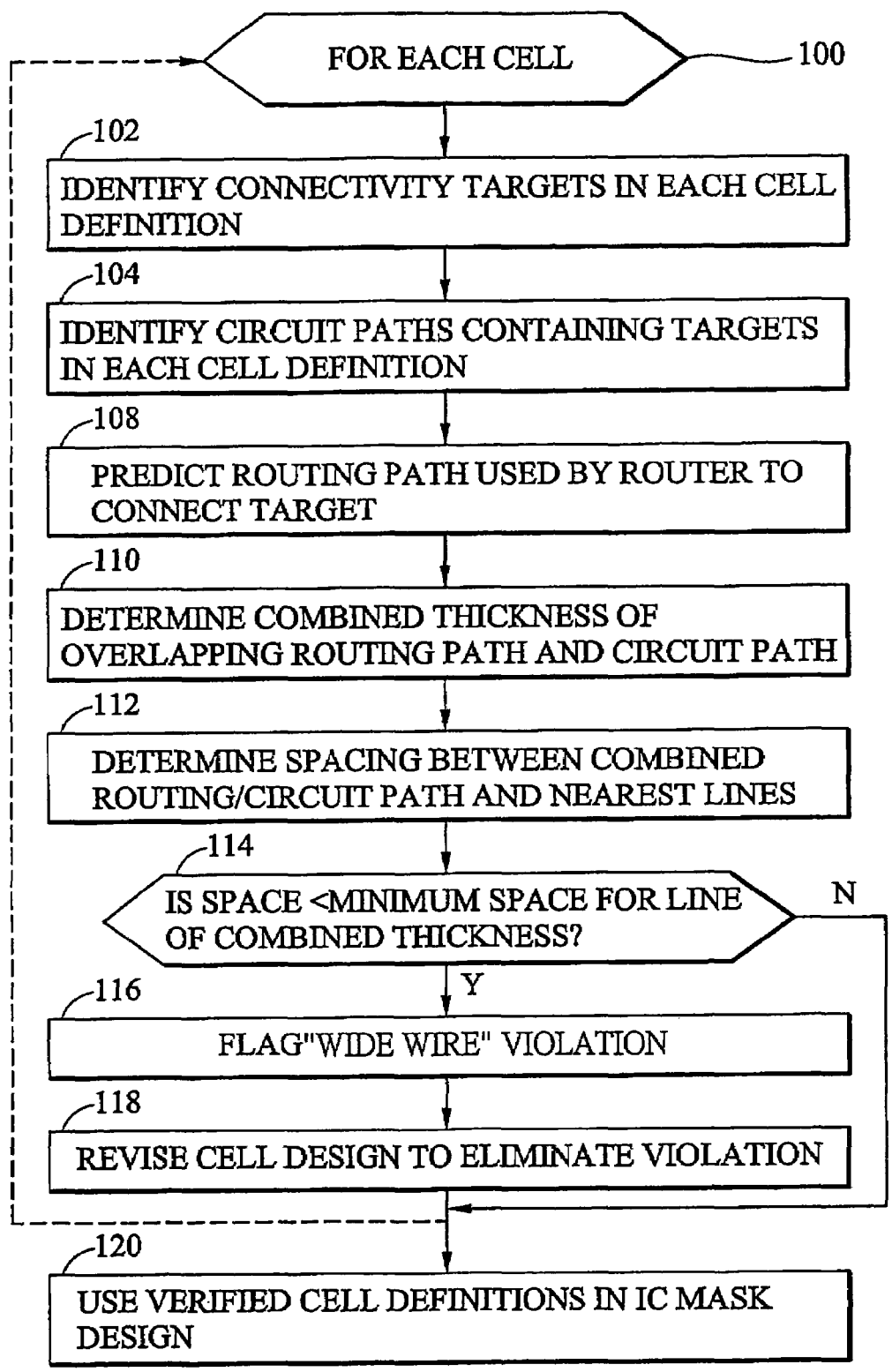
FIG. 1 is a flow chart diagram of an exemplary embodiment of a method according to the invention.

This description of the exemplary embodiments is intended to be read in connection with the accompanying drawings, which are to be considered part of the entire written description. In the description, relative terms such as "lower," "upper," "horizontal," "vertical,", "above," "below," up, "down," "top" and "bottom" as well as derivative thereof (e.g., "horizontally," "downwardly," "upwardly, "etc.) should be construed to refer to the orientation as then described or as shown in the drawing under discussion. These relative terms are for convenience of description and do not require that the apparatus be constructed or operated in a particular orientation.

FIG. 1 is flow chart of an exemplary method for analyzing a set of cell definitions in a cell library. In preferred embodiments, the analysis is performed by a cell library vendor before releasing the cell definitions to an IC layout designer.

At step 100, a loop is repeated for each cell, including steps 102–118.

Figure 2:
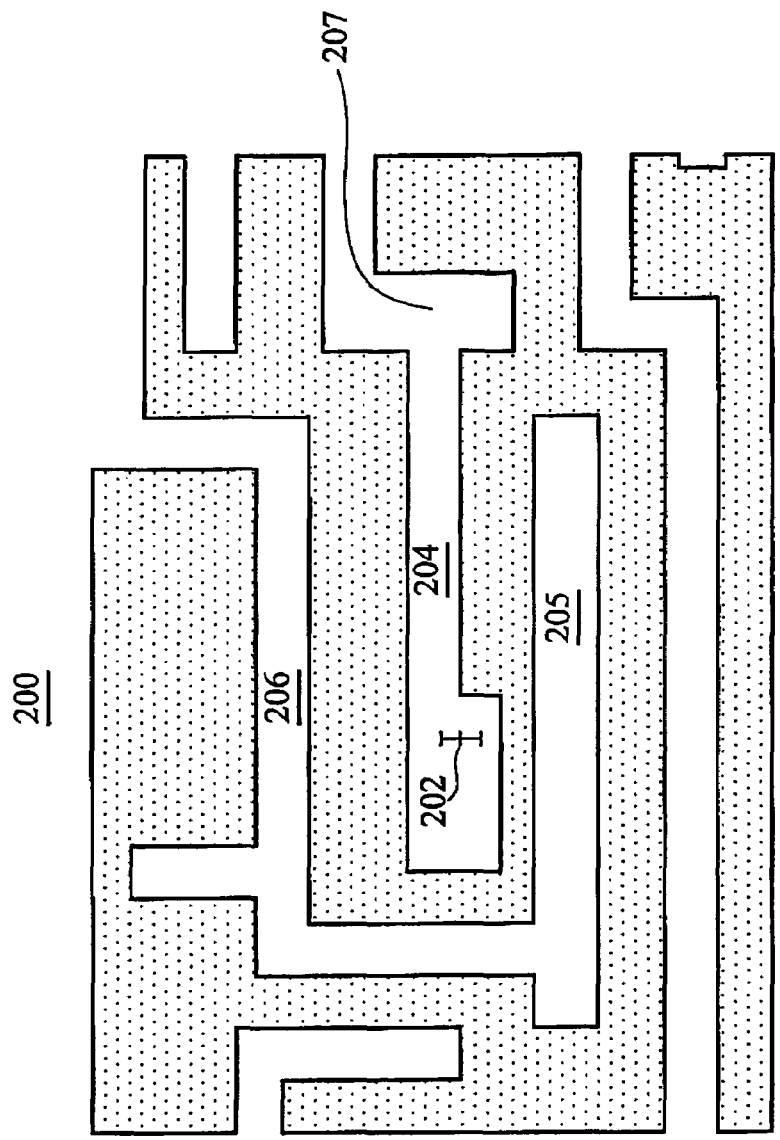
FIG. 2 is a diagram showing a cell from a cell library, with a connectivity target therein.

At step 102, at least one connectivity target is identified in at least one cell definition. FIG. 2 graphically illustrates an example of a cell 200 having a connectivity target 202. It is understood that the cell definition is typically stored in numerical form, in accordance with the GDSII Stream Data format, according to the GDSII Stream Format Manual, Documentation No. B97E060, February 1987, from Cadence Design Systems, Inc., San Jose, Calif. Other formats, such as the GDSII replacement format, or other standard format may be used.

At step 104 (FIG. 1), at least one circuit path is identified in the cell definition. The circuit path either contains the connectivity target of that cell definition, or is connected to a circuit portion containing the connectivity target. For example, in FIG. 2, cell 200 contains a connectivity target 202 located in a circuit portion 203 at the end of a circuit path 204. In the example of FIG. 2, the center of target 202 is offset from the centerline of the circuit path 204, but this is not a requirement for all cell definitions.

At step 108, the routing path that would be used by the router to connect the connectivity target 202 of the cell definition 200 to another structure is predicted.

Figure 3:
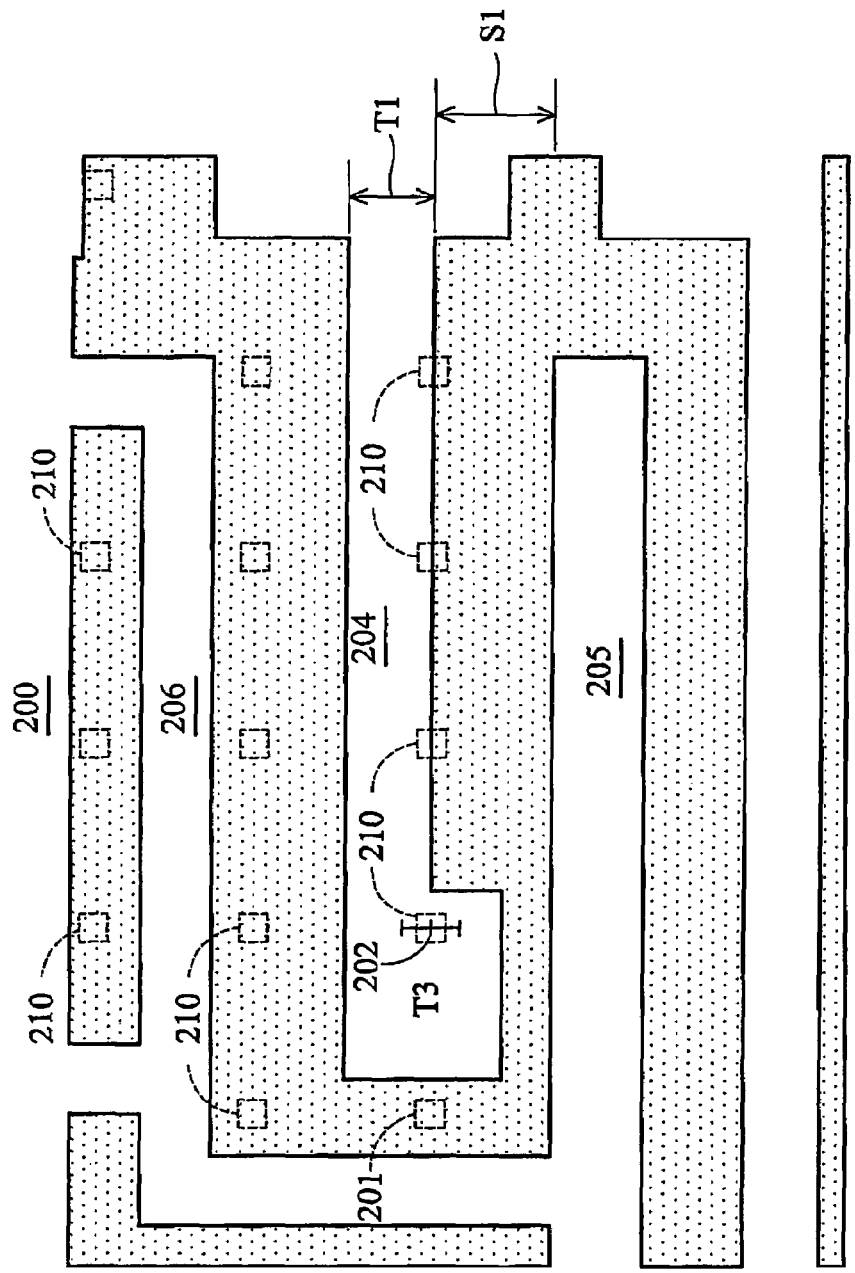
FIG. 3 shows the cell of FIG. 2, with a set of grid points superimposed thereon, one of the grid points coinciding with the center of the target.
Figure 4:
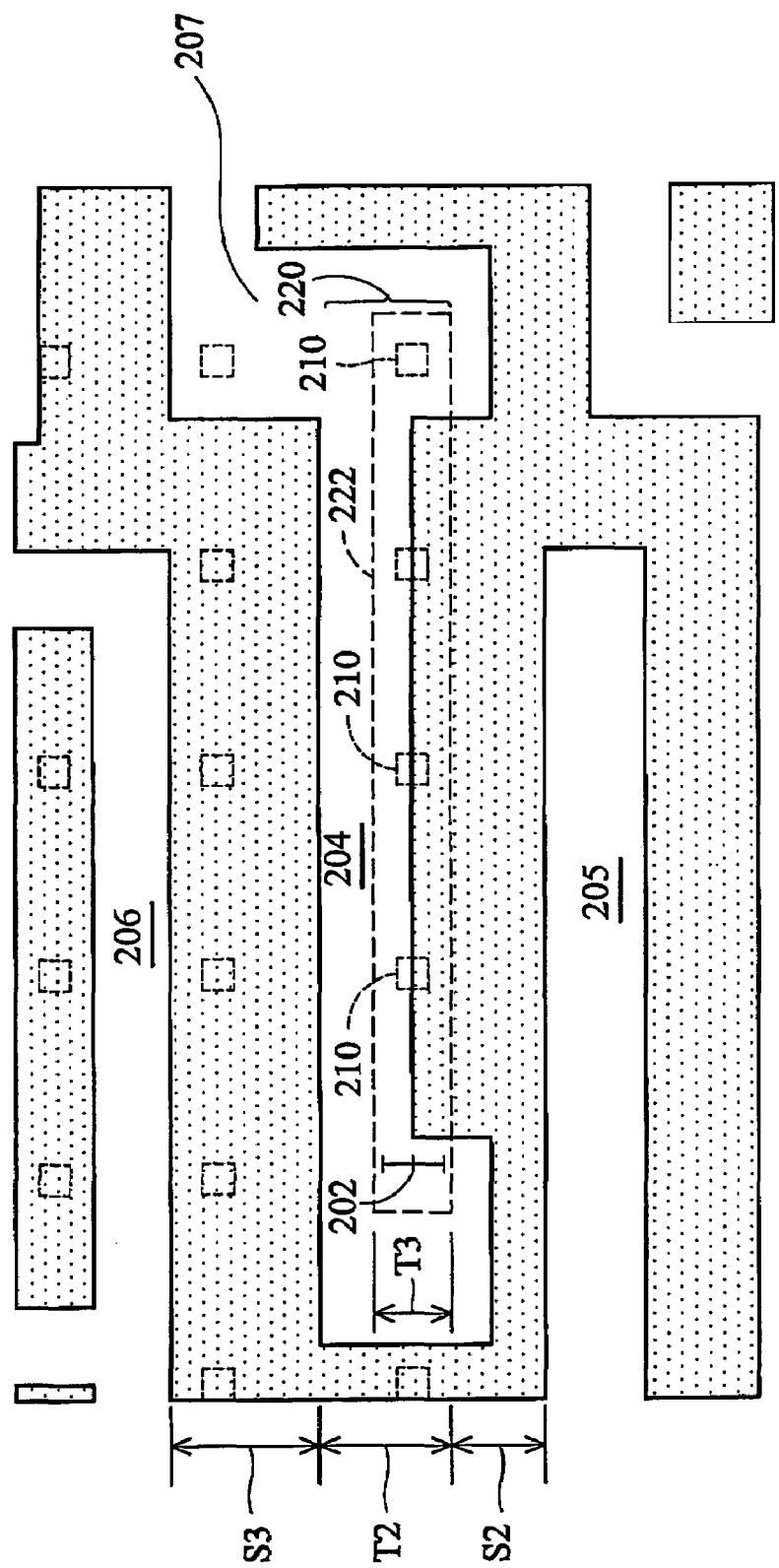
FIG. 4 shows the cell of FIG. 3, with a connecting line superimposed on the circuit path that is connected to the feature containing the connectivity target.

FIGS. 3 and 4 show how the routing path is predicted. A grid is constructed, wherein one of the grid points 210 coincides with the location of the target 202 of the cell definition, and the grid points 210 in the grid are evenly spaced in the horizontal direction and evenly spaced in the vertical direction. (The vertical grid point spacing can, however, be different from the horizontal grid point spacing.) The routing path could be determined by a grid point operation, for example, grid point (210) sizing up to the minimum width T3 for the m1 layer.

The routing path is defined so as to include a horizontal or vertical line in which the target of the one cell definition is centered, wherein the horizontal or vertical line includes at least two of the grid points. If the circuit paths connected to the target include a plurality of bends (such as the "dog leg" double-bend structure 207 shown in FIG. 4), then the grid spacing is selected so that there are grid points in each of the horizontal and vertical segments in the circuit paths connected to the target. For example, FIG. 4 shows a connecting path 222 in phantom. One end of the connecting path is at the target 202, and the other end of the connecting path 222 is at the grid point where the circuit path turns upward. The predicted connecting path 222 is selected so that grid points lie along its centerline, and the line width is a minimum line width T3 (FIG. 4) of the relevant technology (e.g., 0.13 microns). Notably, in the example of FIG. 4, the target 202 is not centered in the circuit path 204, so that the grid points 210 are not centered in the circuit path 204, and the center of the predicted connecting path 222 is offset from the center of the circuit path 204.

At step 110 (FIG. 1), the combined thickness T2 (FIG. 4) of the merged line 220 comprising the overlapping circuit path 204 and predicted routing path 222 is determined. The combination of circuit path 204 and connecting path 222 forms a polygon 220. The polygon may be a rectangle (if circuit path 204 is a rectangle) or a more complex polygon, if circuit path 204 has a non-rectangular shape. A width of the polygon 220 containing the predicted routing path and the circuit path in of the cell definition is identified. This can be done, for example, in the case of a connecting path that is a horizontal line segment, by determining the vertical coordinate of the top boundary of the circuit path 204 and the vertical coordinate of the bottom boundary of the connecting path 222. The distance T2 between these two boundary lines is the combined width of the merged line 220 when a mask is formed using a layout that includes the connected cells.

At step 112, the spacings S2 and S3 between the combined (merged) circuit path 220 and the closest adjacent lines 205 and 206, respectively, are identified. Of these two spacings, the smaller of the two S2 is identified as the distance between the polygon 220 and a closest nearby line 205 of that cell definition.

The minimum line spacing (according to the design rules used to define the cells) for a line having the width T2 is identified. The minimum line spacing is a predetermined distance that can be different for each technology (e.g., the minimum spacing for 65 nanometer ICs is different from that of 0.13 micron ICs, which is different from that of 0.18 micron ICs.) When T2 is greater than the nominal line width T1 for the given technology—as is the case in FIGS. 3 and 4—the line spacing required for the merged line 220 may be greater than the line spacing of the cell 200.

At step 114, the predicted line spacing S2 is compared to the minimum line spacing for a line having the identified width T2. A determination is made whether a combination 220 of the predicted routing path 222 and the circuit path 204 causes a violation of an integrated circuit design rule, such as the minimum line width. If the predicted line spacing S2 is less than or equal to the minimum, then there is no violation, and steps 116 and 118 are skipped for this pair of targets.

At step 116, a "wide wire" design rule violation is flagged, indicating that the merged path 220 is too wide for the spacing between lines in the cell (i.e., the line spacing is not sufficient, given the design rule for the width of the merged line).

At step 118, in response to the determination of a violation, the cell designer is alerted to change the design of the cell definition to eliminate the violation of the integrated circuit design rule. Depending on the individual cell design, this may be accomplished by moving one or more lines (e.g., 204, 205 or 206) to increase line spacing to the appropriate spacing for "wide wires," or by shifting the circuit path 204 to be aligned with the predicted routing path 222, so that there is no "wide wire," allowing compliance with the less restrictive spacing design rule of the nominal line width for cell 200.

At step 120, the verified cells are used in an IC mask design.

By predicting the location of possible routing paths for each cell, the cell library vendor is able to proactively correct the cell designs, before making the cell definitions available for use by the IC layout designer, and before the IC layout designer performs the step of actually combining the cell definitions to incorporate the cell designs in an integrated circuit product design. This avoids the occurrence of "wide wire" design rule violations in the IC layout design stage and the accompanying cost and schedule impacts. Because any two cells in the library can be connected, performing the analysis (and, if necessary, design adjustments) for each cell ensures that the entire library of cells can be used in any arrangement without causing wide wire violations.

In one embodiment of the method, the determination of whether the line spacing constraints are violated is made using a Calibre rule. The following Calibre code may be used for this purpose. The lines beginning with "//" are comments.

```
// 1. Separate the connectivity target and the other metal
polygons.
BONE_m1      = Mli_txt_notM1DY WITH TEXT "I"
BONE_other   = Mli NOT WITH TEXT "I"
//2. Specify routing grid points involved in the target metal
polygon.
H_EDGE       = LENGTH (ANGLE BONE_m1 == 0 ) > 0.14
H_POLYGON    = EXTENTS (MERGE (EXPAND EDGE
               H_EDGE
INSIDE BY 0.12))
   DROP      = GRID_in_size INTERACT H_POLYGON
//3. Emulate routing path by using the specified grid points.
   DROPEDGE_ = EXPAND EDGE (ANGLE DROP= =90)
   G           OUTSIDE BY
   ((X_PITCH - M1_WIDTH)/2)
   BONESHAPE = DROPEDGE_G OR DROP
   BONE      = BONESHAPE NOT (EXPAND EDGE (ANGLE
BONESHAPE= =90) INSIDE BY ((X_PITCH - M1_WIDTH)/2))
//4. Wide Wire formation and violation check.
   A         = EXT [BONE] BONE other <0.12
   REALBONE  = BONE NOT WITH EDGE A
   WWire     = SIZE (REALBONE OR BONE_m1) BY 0.09
UNDEROVER
   X2        = EXT [WWire] BONE_other < 0.17
               OPPOSITE
MEASURE ALL
   Y2        = EXT WWire [BONE_other] < 0.17
               OPPOSITE
MEASURE ALL
   LENGTH X2 > 0.52
   LENGTH Y2 > 0.52
}
```

Although FIG. 1 shows a set of steps in one particular order, the steps may be performed in different sequences. For example, the step 118 of revising cell designs to eliminate wide wire violations can be performed after all of the combinations of cells are analyzed. It is not necessary to analyze and correct each cell before analyzing the next cell.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard disk drives, high density (e.g., ZIP™) diskettes, electrically erasable programmable ROM (EEPROM), flash memory, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for analyzing a cell definition, comprising the steps of:
   identifying at least one connectivity target in at least one cell definition;
   identifying at least one circuit path in the at least one cell definition, the at least one circuit path containing or connected to a circuit portion containing the at least one connectivity target of that cell definition;
   predicting a routing path to be used by a router to connect the at least one target in the at least one cell definition to another structure;
   predicting a combination to be formed by the router from the routine path and the circuit path; and
   determining whether the predicted combination of the routing path and the circuit path has a dimension that violates an integrated circuit design rule.

2. The method of claim 1, wherein the determining step is performed before performing a further step of incorporating the at least one cell definition in an integrated circuit product design.

3. The method of claim 2, further comprising:
   changing a design of the at least one cell definition to eliminate the violation of the integrated circuit design rule in response to the determination of a violation, before performing the step of incorporating the at least one cell definition in an integrated circuit product design.

4. The method of claim 1, wherein the integrated circuit design rule specifies a minimum line spacing associated with a given line width.

5. The method of claim 4, wherein the combination predicting step includes:
   identifying a width of a polygon containing the predicted routing path and the circuit path in the at least one cell definition;
and the determining step includes:
   determining the minimum line spacing for a line having the identified width,
   identifying a distance between the polygon and a closest nearby line of that cell definition; and
   comparing the distance to the minimum line spacing for a line having the identified width.

6. The method of claim 5, wherein the polygon represents a line formed by the router to combine the circuit path and the routing path, which overlap each other, into a single line.

7. The method of claim 1, wherein routing path predicting step includes:
   determining locations of grid points in a grid, wherein one of the grid points coincides with the location of the target of the at least one cell definition;
   defining the routing path so as to include a horizontal or vertical line in which the target of the at least one cell definition is centered, wherein the horizontal or vertical line includes at least two of the grid points.

8. The method of claim 1, wherein the target identifying step, the circuit path identifying step, the routing path predicting step, the combination predicting step, and the determining step are performed for each cell definition within the cell library, before the cell library is used to make an integrated circuit product design.

9. The method of claim 1, wherein the cell definitions are in GDSII format.

10. The method of claim 1, wherein the determining step is performed using a Calibre rule.

11. A computer readable medium encoded with computer program code, wherein, when the code is executed by a processor, the processor performs a method for analyzing a cell definition, comprising the steps of:

identifying at least one connectivity target in at least one cell definition;

identifying at least one circuit path in the at least one cell definition, the at least one circuit path containing or connected to a circuit portion containing the at least one connectivity target of that cell definition;

predicting a routing path to be used by a router to connect the connectivity target in the at least one cell definition to another structure;

predicting a combination to be formed by the router from the routing path and the circuit path; and determining whether the predicted combination of the routing path and the circuit path has a dimension that violates an integrated circuit design rule.

12. The computer readable medium of claim 11, wherein the integrated circuit design rule specifies a minimum line spacing associated with a given line width.

13. The computer readable medium of claim 12, wherein the combination predicting step includes:

identifying a width of a polygon containing the predicted routing path and the circuit path in the cell definition; and the determining step includes:

determining the minimum line spacing for a line having the identified width, identifying a distance between the polygon and a closest nearby line of the cell definition; and comparing the distance to the minimum line spacing for a line having the identified width.

14. The computer readable medium of claim 13, wherein the polygon represents a line formed by the router to combine the circuit path and the routing path, which overlap each other, into a single line.

15. The computer readable medium of claim 11, wherein the routing path predicting step includes:

determining locations of grid points in a grid, wherein one of the grid points coincides with the location of the target of the cell definition;

defining the routing path so as to include a horizontal or vertical line in which the target of the cell definition is centered, wherein the horizontal or vertical line includes at least two of the grid points.

16. A system for analyzing a cell definition, comprising:

means for identifying at least one connectivity target in at least one cell definition;

means for identifying at least one circuit path in the at least one cell definition, the at least one circuit path containing or connected to a circuit portion containing the at least one connectivity target of the cell definition;

means for predicting a routing path to be used by a router to connect respective connectivity targets in the at least one cell definition;

means for predicting a combination to be formed by the router from the routing path and the circuit path; and means for determining whether the predicted combination of the routing path and the circuit path has a dimension that violates an integrated circuit design rule.

17. The system of claim 16, wherein the means for determining whether a dimension violates an integrated circuit design rule is capable of identifying the violation before the at least one cell definition is incorporated in an integrated circuit product design.

18. The system of claim 16, wherein the integrated circuit design rule specifies a minimum line spacing associated with a given line width.

19. An integrated circuit mask set designed using cell definitions that are processed by a method comprising the steps of:

identifying at least one connectivity target in at least one cell definition;

identifying at least one circuit path in the at least one cell definition, the at least one circuit path containing or connected to a circuit portion containing the at least one connectivity target of the cell definition;

predicting a routing path to be used by a router to connect respective connectivity targets in the at least one cell definition;

predicting a combination to be formed by the router from the routing path and the circuit path; and determining whether the predicted combination of the routing path and the circuit path has a dimension that violates an integrated circuit design rule.

20. The mask set of claim 19, wherein the determining step is performed before performing a further step of incorporating the at least one cell definition in an integrated circuit product design.

21. The mask set of claim 20, wherein the method further comprises:

changing a design of the at least one cell definition to eliminate the violation of the integrated circuit design rule in response to the determination of a violation, before performing the step of incorporating the cell definition in an integrated circuit product design.

22. The mask set of claim 19, wherein the integrated circuit design rule specifies a minimum line spacing associated with a given line width.

23. The mask set of claim 19, wherein the target identifying step, the circuit path identifying step, the routing path predicting step, the combination predicting step, and the determining step are performed for each pair of cell definitions included in the mask set design, before the cell definitions are used to make an integrated circuit product design.

* * * * *

UNITED STATES PATENT AND TRADEMARK OFFICE
CERTIFICATE OF CORRECTION

| | | |
|---|---|---|
| PATENT NO. | : 7,010,770 B2 | Page 1 of 1 |
| APPLICATION NO. | : 10/407352 | |
| DATED | : March 7, 2006 | |
| INVENTOR(S) | : Eric Liang and Mu-Jen Huang | |

It is certified that error appears in the above-identified patent and that said Letters Patent is hereby corrected as shown below:

Column 6, line 11, delete "routine" and insert therefore -- routing --.

Signed and Sealed this

Thirty-first Day of July, 2007

JON W. DUDAS
*Director of the United States Patent and Trademark Office*